United States Patent
Sechi et al.

(10) Patent No.: US 6,265,334 B1
(45) Date of Patent: *Jul. 24, 2001

(54) CERAMIC SINTERED PRODUCT AND PROCESS FOR PRODUCING THE SAME

(75) Inventors: Yoshihisa Sechi; Masahiro Sato; Hiroshi Aida; Shoji Kohsaka, all of Kokubu (JP)

(73) Assignee: Kyocera Corporation, Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/177,977

(22) Filed: Oct. 22, 1998

(30) Foreign Application Priority Data

| Oct. 24, 1997 | (JP) | ................................................ 9-292765 |
| Jan. 21, 1998 | (JP) | ............................................... 10-009720 |
| Feb. 23, 1998 | (JP) | ............................................... 10-040811 |
| May 29, 1998 | (JP) | ............................................... 10-149384 |

(51) Int. Cl.⁷ .................................................. C04B 35/195
(52) U.S. Cl. ................................................. 501/9; 501/119
(58) Field of Search .......................................... 501/119, 9

(56) References Cited

U.S. PATENT DOCUMENTS

| 3,958,058 | * | 5/1976 | Elmer .................................... 428/220 |
| 4,063,955 | * | 12/1977 | Fritsch et al. . | |
| 4,194,917 | * | 3/1980 | Sakemi . | |
| 4,280,845 | * | 7/1981 | Matsuhisa et al. ..................... 264/66 |
| 4,403,017 | * | 9/1983 | Bind ....................................... 428/702 |
| 4,495,300 | * | 1/1985 | Suno ....................................... 501/102 |
| 4,587,067 | * | 5/1986 | Agrawal et al. ......................... 264/63 |
| 4,722,916 | * | 2/1988 | Watanabe et al. ..................... 501/118 |
| 4,851,376 | * | 7/1989 | Asami et al. .......................... 501/119 |

FOREIGN PATENT DOCUMENTS

| 3616045 | * | 11/1986 | (DE) . |
| 167649 | * | 1/1986 | (EP) . |
| 51-039706 | * | 4/1976 | (JP) . |
| 56-155068 | * | 12/1981 | (JP) . |
| 59-203767 | * | 11/1984 | (JP) . |
| 61-072679 | * | 4/1986 | (JP) . |
| 62-030656 | * | 2/1987 | (JP) . |
| 08198665 | * | 8/1996 | (JP) . |

* cited by examiner

*Primary Examiner*—Paul Marcantoni
(74) *Attorney, Agent, or Firm*—Hogan & Hartson, LLP.

(57) ABSTRACT

Low thermal expansion ceramics contains a cordierite crystal phase, wherein a phase of a crystalline compound containing at least one element selected from the group consisting of an alkaline earth element other than Mg, a rare earth element, Ga and In, is precipitated in the grain boundaries of said crystal phase, said ceramics has a relative density of not smaller than 95%, a coefficient of thermal expansion of not larger than $1\times10^{-6}/°$ C. at 10 to 40° C., and a Young's modulus of not smaller than 130 GPa. That is, the ceramics has a small coefficient of thermal expansion, is deformed very little depending upon a change in the temperature, has a very high Young's modulus and is highly rigid and is resistance against external force such as vibration. Accordingly, the ceramics is very useful as a member for supporting a wafer or an optical system is a lithography apparatus that forms high resolution circuit patterns on a silicon wafer.

7 Claims, 1 Drawing Sheet

FIG. 1

CERAMIC SINTERED PRODUCT AND PROCESS FOR PRODUCING THE SAME

BACKGROUND OF THE INVENTION

1. Field of the Invention

The present invention relates to ceramics that thermally expands little containing cordierite as a main crystal phase. In particular, the invention relates to ceramics that thermally expands little and is adapted for use in various devices used for a process for producing semiconductors, such as a semiconductor wafer support fitting like a vacuum chuck, succeptor, electrostatic chuck, or a stage or a member for supporting an optical element in a lithography apparatus.

2. Description of the Prior Art

The cordierite-type sintered product has heretofore been known as ceramics that thermally expands little, and has been used for filters, honeycombs and refractories. The cordierite-type sintered product is obtained by using a cordierite powder or a powder in which is mixed MgO, $Al_2Do_3$ and $SiO_2$ in amounts capable of forming cordierite, by adding, to this powder, a sintering assistant such as an oxide of a rare earth element, $SiO_2$, CaO or MgO, molding the mixture into a predetermined shape, and firing the obtained molded article at 1000 to 1400° C. (Japanese Examined patent Publication (Kokoku) No. 3629/1982 and Japanese Unexamined Patent Publication (Kokai) No. 229760/1990).

Various members used for the process for producing semiconductors such as LSIs, e.g., semiconductor wafer support fittings such as vacuum chuck, succeptor, electrostatic chuck, and a stage and members for supporting an optical element is a lithography apparatus, have heretofore been produced by using ceramics such as alumina or silicon nitride on account of the reason that it is chemically stable and is obtained at a reduced cost. Accompanying a trend toward a high integration degree in the LSIs in recent years, however, high resolution circuits have been formed in the semiconductor wafer requiring high degree of precision. For example, the lines of the circuits have a width of the order of submicrons. In a lithography apparatus used for forming the circuits of this kind, the positioning precision required for the stage for holding the wafer in which the circuit is to be formed must be 100 nm or smaller. The ceramics such as alumina and silicon nitride have considerably large coefficients of thermal expansion at 10 to 40° C. ($5.2 \times 10^{-6}$/° C. in the case of alumina, and $1.5 \times 10^{-6}$/° C. in the case of silicon nitride). With such ceramics, a change of 0.1° C. in the temperature of the atmosphere results in the deformation of about several hundred nanometers, making it no longer possible to satisfy the above-mentioned requirement of precision.

It has also been proposed already to apply the cordierite-type sintered product to various parts used for a process for producing semiconductors (Japanese Unexamined Patent Publication (Kokai) No. 191422/1989, Japanese Examined Patent Publication (Kokoku) No. 97675/1994). The cordierite-type sintered product thermally expands less than the above-mentioned alumina or silicon nitride, and is favorable form the standpoint of preventing a drop in the precision of the circuit caused by thermal expansion. This sintered product, however, has low rigidity which is a defect. That is, the semiconductor wafer support member such as a stage in the lithography apparatus moves at a high speed to a region where the exposure to light is to be executed, stops at a predetermined position and , then, the wafer placed on the support member is exposed to light. The support member made of the cordierite-type sintered product having a low rigidity develops vibration when it has stopped moving, and the exposure to light is executed in a vibrating state, resulting in a drip in the precision of exposure to a conspicuous degree. The drop in the precision of exposure becomes conspicuous as the lines of the circuit formed by exposure to light become fine, casting a fatal problem from the standpoint of forming high resolution circuits.

Moreover, the members supporting the optical elements in the lithography apparatus transmits vibration to the optical elements accompanying the motion of the stage. When the exposure is effected relying upon such optical elements, therefore, the light beam vibrates causing the focal point to be blurred or deviated and, eventually, causing the precision of exposure to be greatly deteriorated.

SUMMARY OF THE INVENTION

The object of the present invention, therefore, is to provide ceramics that thermally expands little and has a high rigidity (high Young's modulus) and a process for producing the same.

Another object of the present invention is to provide cordierite ceramics that thermally expands little, has a high Young's modulus, and can be effectively used for various members in a process for producing semiconductors owing to the above-mentioned properties, and a process for producing the same.

According to the present invention, there is provided low thermal expansion ceramics containing a cordierite crystal phase, wherein a phase of a crystalline compound containing at least one element selected from the group consisting of an alkaline earth element other than Mg, a rare earth element, Ga and In, is precipitated in the grain boundaries of said crystal phase, said ceramics having a relative density of not smaller than 95%, a coefficient of thermal expansion of not larger than $1 \times 10^{-6}$/° C. at 10 to 40° C., and a Young's modulus of not smaller than 130 GPa.

According to the present invention, there is further provided a process for producing low thermal expansion ceramics containing a cordierite crystal phase, comprising:

preparing a molded article that contains a cordierite component and an oxide containing at least one element selected from the group consisting of an alkaline earth element other than Mg, a rare earth element, Ga and In, or a compound component capable of forming said oxide;

firing said molded article at a temperature of from 1100° C. to 1500° C. to obtain a sintered product having a relative density of not smaller than 95%, and cooling said sintered product from at least the firing temperature down to 1000° C. at a temperature drop rate of not larger than 10° C./min.

According to the present invention, furthermore, there is provided a process for producing ceramics that thermally expand little containing a cordierite crystal phase, comprising:

preparing a molded article that contains a cordierite component and an oxide containing at least one element selected from the group consisting of an alkaline earth element other than Mg, a rate earth element, Ga and In, or a compound component capable of forming said oxide;

firing said molded article at a temperature of form 1300° C. to 1500° C. to obtained a sintered product having a relative density of not smaller than 905.

subjecting said sintered product to a hot hydrostatic treatment in a pressurized atmosphere of not lower than 100 atms. at a temperature of form 1100 to 1400 ° C.; and cooling said sintered product from at least the temperature of said hot hydrostatic treatment down to 1000° C. at a temperature drop rate of not larger than 10° C./min.

DETAILED DESCRIPTION OF THE INVENTION

The ceramics of the present invention has a main crystal phase formed of cordierite and, hence, thermally expands little.

Cordierite is a composite oxide represent ideally by the following formula, $$2MgO \cdot 2Al_2O_3 \cdot 5SiO_2 \qquad (I)$$

and is present in the form of crystalline particles having an average particle diameter of from 1 to 10 μm in the ceramics. The ceramics thermally expands less as the content of the cordierite crystal phase increase. The ceramics of the present invention contains the cordierite crystal phase in such an amount that the coefficient of thermal expansion is not larger than $1 \times 10^{-6}/°$ C. and, particularly, not larger than $0.5 \times 10^{-6}/°$ C. at 10 to 40° C.

In the present invention, furthermore, it is very important that a crystalline compound containing at least one element selected from the group consisting of alkaline earth element other than Mg, rare earth element, Ga and In, is precipitated on the grain boundaries of the cordierite crystal phase. This prevents a drop in the coefficient of thermal expansion and, at the same time, helps increase the Young's modulus.

The above-mentioned element component is used as a sintering assistant, and forms a liquid phase upon reacting with some of the components in the cordierite during the firing, contributing to enhancing the sintering property. The cordierite has a low sintering property and cannot be densely sintered. Upon firing the cordierite by using the sintering assistant in combination, however, there can be obtained a dense ceramics having a relative density of not smaller than 95%, preferably, not smaller than 96% and, most desirably, not smaller than 97%. Besides, in the present invention, the element component is precipitated on the grain boundaries of the cordierite crystal phase as, for example, a disilicate expressed by the following general formula (1a), $$(M^1)_2Si_2O_7 \qquad (1a)$$

wherein $M^1$ is a rare earth element, Ga or In, or as an aluminosilicate such as celsian, anorthite or slawsonite expressed by the following general formula (1b), $$(M^2) \, Si_2Al_2O_8 \qquad (1b)$$

wherein $M^2$ is an alkaline earth element other than Mg.

Such a crystalline compound has a dense atomic arrangement. Upon precipitating the crystalline compound on the grain boundaries, the grain boundaries are reinforced, the Young's modulus is improved and the coefficient of thermal expansion is decreased. Therefore, the ceramics of the present invention does not exhibit a large coefficient of thermal expansion owing to the use of the sintering assistant, but exhibits a large relative density. Besides, since the disilicate or the aluminosilicate is precipitated on the grain boundaries, the ceramics of the invention exhibits a Young's modulus of not smaller than 130 GPa. To precipitate the disilicate or the aluminosilicate on the grain boundaries, the cooling after the firing must be conducted under predetermined conditions as will be described later.

In the present invention., preferred examples of the rare earth element include Y, Yb, Er, Sm, Dy and Ce. The rare earth element is contained in the ceramics at a ratio of from 1 to 20% by weight and, particularly, from 2 to 15% by weight in terms of an oxide. Besides, the alkaline earth element other than Mg. or Ga or In is contained at a ratio of from 0.5 to 10% by weight and , particularly, from 2 to 8% by weight in terms of an oxide thereof. When these element components are used in amounts larger than the above-mentioned ranges, the cordierite component reacts in an increased amount with these element components, causing the coefficient of thermal expansion to increase. When the amounts of these element components are smaller than the above-mentioned ranges, on the other hand, the disilicate or the aluminosilicate does not precipitate in a sufficient amount on the grain boundaries of the cordierite crystal phase and, hence, the ceramics exhibits a decreased Young's modulus. Besides, the sintering property of the cordierite is not improved, and a dense ceramics having a relative density of not smaller than 95% is not obtained.

The above-mentioned disilicate or the aluminosilicate is formed by the reaction of $SiO_2$ and $Al_2O_3$ only in the cordierite crystal phase with the element components used as the sintering assistant. Therefore, the cordierite crystal phase in the ceramics does not necessarily have the composition expressed by the above-mentioned formula (I), but may have a nonstoicheometrical composition which MgO or $Al_2O_3$ which is a residue of the reaction remains as a solid solution in the cordierite crystal phase.

An oxide of Sn or Ge can be effectively used as a sintering assistant mostly dissolving, however, in the cordierite crystal phase as a solid solution. It is therefore desired that these oxides re used in combination with the above-mentioned components.

It is desired that the ceramics of the present invention contains at least one silicon compound selected from the group consisting of silicon nitride, silicon carbide and silicon oxinitride, in addition to the above-mentioned components. Here, the silicon oxinitride is a compound having an Si—N—O bond, and is expressed by, for example, $Si_2N_2O$. These silicon compounds are present as crystalline particles in the ceramics, and exhibit large Young's moduli by themselves. By containing these components, therefore, the Young's modulus can be further increased without increasing the coefficient of thermal expansion of the ceramics. For instance, the ceramics containing such a silicon compound exhibits a Young's modulus of not smaller than 150 MPa. In the present invention, the silicon nitride is most preferred among the above-mentioned three kinds of silicon compounds.

It is desired that the silicon compound for improving the Young's modulus is contained in the ceramics in an amount of not larger than 30% by weight and, particularly, from 5 to 20% by weight. When this amount is larger than the above-mentioned range, the ceramics exhibits an increased coefficient of thermal expansion deteriorating excellent properties, i.e., low thermal expansion of the cordierite.

The ceramics of the present invention having the above-mentioned composition is a densely sintered product and has a relative density of not smaller than 95%, preferably, not smaller than 96% and, most preferably, not smaller than 97%, and having a coefficient of thermal expansion at 10 to 40° C. of not larger than $1 \times 10^{-6}/°$ C. and, particularly, not larger than $0.5 \times 10^{-6}/°$ C. and a Young's modulus of not smaller than 130 GPa and, preferably, not smaller than 140 GPa, and most preferably, not smaller than 150 GPa. Therefore, the ceramics is deformed very little depending upon a change in the temperature, and exhibits a high rigidity. On account of these properties, the ceramics of the invention is used as constituent parts in a variety of industrial machines and particularly, in a vacuum apparatus, susceptor, vacuum chuck, electrostatic chuck and lithography apparatus used for the process for producing semiconductors. In particular, the ceramics of the present invention is very useful as parts constituting the lithography apparatus for forming ultrafine circuit patterns on a semiconductor wafer.

The ceramics of the present invention may contain carbon in an amount of from 0.1 to 2.0% by weight and, particularly, from 0.5 to 1.5% by weight. The ceramics containing carbon exhibits a black color and can be effectively used for the applications where the light-shielding property is required, such as a mirror cylinder or a light-shielding plate in the lithography apparatus.

The ceramics of the present invention is very dense upon being prepared by firing under a predetermined condition or upon being prepared by the heat treatment under a predetermined condition after the firing, and has a porosity of not larger than 0.1% and, particularly, not larger than 0.08%, and a maximum void diameter of not larger than 5 $\mu$m and, particularly, not larger than 4.5 $\mu$m. The dense ceramics having such a porosity and a maximum void diameter, has a realtive density of, for example, not smaller than 99.5% and, particularly, not smaller than 99.9%, and excellent surface smoothness. According, the ceramics is most suited as parts which are coated on the surfaces thereof or as members on which the surfaces are formed a thin film (0.1 to 10 $\mu$m) of TiN, $Al_2O_3$, diamond, diamond-like carbon (DLC) such as a vacuum chuck or a mirror used for measuring the position of the stage (wafer-support member) in the lithography apparatus.

Preparation of the Ceramics

As a starting material for producing the low thermal expansion ceramics of the present invention, there can be used a mixed powder of a cordierite powder having an average particle diameter of not larger than 10 $\mu$m, a sintering assistant and, as required, at least one silicon compound selected from the group consisting of silicon nitride, silicon carbide and silicon oxinitride or a carbon powder. In this case, instead of using the cordierite powder, there can be used the powders of MgO, $Al_2O_3$ and $SiO_2$ being mixed together, so that the cordierite can be formed upon the firing.

The sintering assistant contains an element for forming the above-mentioned disilicate or aluminosilicate, i.e., contains at least one of alkaline earth element other than Mg, rare earth element, Ga and In. The sintering agent is used as an oxide containing these elements, or as a carbide, a hydroxide or a carbonate that forms an oxide upon the firing.

The sintering assistant and the silicon compound or carbon that is blended as required, are used so as to be present in the ceramics at the above-mentioned ratios. In order to obtain the ceramics that thermally expand little exhibiting a coefficient of thermal expansion at 10 to 40° C. of, for example, not larger than $1.0 \times 10^{-6}$/° C., the amount of the cordierite powder should not be smaller than 80% by weight of the whole amount.

The above-mentioned mixture powder is homogeneously mixed together in a ball mill or the like device, and is molded into a predetermined shape, the molding is effected by a known means, such as metal mold press, cold hydrostatic press, extrusion molding, doctor blade method or rolling method, In this case, it is desired that the molded article has a density of not smaller than 55% from the standpoint of obtaining ceramics having a high relative density.

Next, the molded article is fired and is then cooled to obtain the low thermal expansion ceramics of the present invention.

The firing is executed in an oxidizing atmosphere or in an inert atmosphere such as of nitrogen or argon under normal pressure or under an elevated pressure of not lower than 100 $kg/cm^2$ or, particularly, not lower than 150 $kg/cm^2$. When the silicon compound such as silicon nitride, silicon carbide or silicon oxinitride us used, in particular, the firing should be effected in an inert atmosphere so that the silicon compound is not oxidized.

The firing temperature is usually form 1100 to 1500° C. When the firing is conduced under normal pressure, however, it is desired that the firing temperature is set to be relatively high, e.g., from 1300 to 1500° C. and, particularly, from 1300 to 1400° C. When the firing is conduced under an elevated pressure, on the other hand, it is desired that the firing temperature is set to be relatively low, e.g., from 1100 to 1400° C. and, particularly, from 1150 to 1400° C. this is because when the firing temperature is low, a sufficiently densely sintered product is not obtained and when the firing temperature is too high, on the other hand, the starting powder in the molded article melts.

Due to the above-mentioned firing, the sintering assistant reacts with some of the components in the cordierite to form a liquid phase. Accordingly, the sintering property of the cordierite is improved, and a sintered product having a relative density of not smaller than 95% is obtained.

The above-mentioned black ceramics containing carbon can also be prepared by firing the starting powder in an atmosphere containing carbon without mixing the predetermined amount of carbon powder into the starting powder. For example, the molded article is arranged in a mold made of carbon and is fired under an elevated pressure condition. Or, the molded article is buried in the carbon powder and is fired. By such firing, carbon infiltrates into the sintered product, thereby to obtain a desired black ceramics. In any case, it is desired that the firing for obtaining the black ceramics is conducted in an atmosphere of an oxygen partial pressure of not larger than 0.2 atms. and, particularly, not larger than 0.1 atms., while flowing a nitrogen gas, an argon gas or a $CO/CO_2$ gas. This is because, when the firing is conducted in an atmosphere having a high oxygen partial pressure, carbon reacts with oxygen and is released to the outside of the sintered product.

In the present invention, the firing is conducted under the above-mentioned elevated pressure condition to obtain a very densely sintered product (relative density of not smaller than 9.5%) having a porosity of not larger than 0.1% and, particularly, not larger than 0.08%, and a maximum void diameter of not larger than 5 $\mu$m and, particularly, not larger than 4.5 $\mu$m.

When the firing is conducted under normal pressure, too, there can be obtained a densely sintered product having a very small porosity and a very decreased maximum void diameter upon executing the heat treatment under an elevated pressure condition, the heat treatment is conducted in a gaseous atmosphere such as of nitrogen, argon or air under an elevated pressure condition of not lower than 100 atms. at a temperature of from 1100 to 1200° C. for about 1 to about 5 hours. The sintered product becomes more dense due to the heat treatment conducted under such an elevated pressure condition. Accordingly, the relative density of the sintered product after fired under normal pressure needs not necessary be larger than 95%, but needs be not smaller than at least 90%. That is, when the sintered product has a relative density of smaller than 90%, a gas of a high pressure is trapped in the pores in the sintered product. Therefore, the voids cannot be decreased despite the heat treatment is conducted in a subsequent step under a high pressure condition.

After the above-mentioned firing or heat treatment is conducted under an elevated pressure condition, the sintered product is cooled down to normal temperature. Here, in the present invention, it is important that the cooling down to at least 1000° C. is effected at a rate of not larger than 10° C./min. and, particularly, at a rate of not larger than 5° C./min. Owing to the gradual cooling, the disilicate or the aluminosilicate derived form the sintering assistant precipitates on the grain boundary of the cordierite crystal phase, making it possible to obtain low thermal expansion ceramics having a high Young's modulus. When the cooling rate is larger than the above-mentioned range, the disilicate or aluminosilicate is not precipitated in a sufficient amount, and the ceramics having a high Young's modulus is not obtained.

Figure 1:
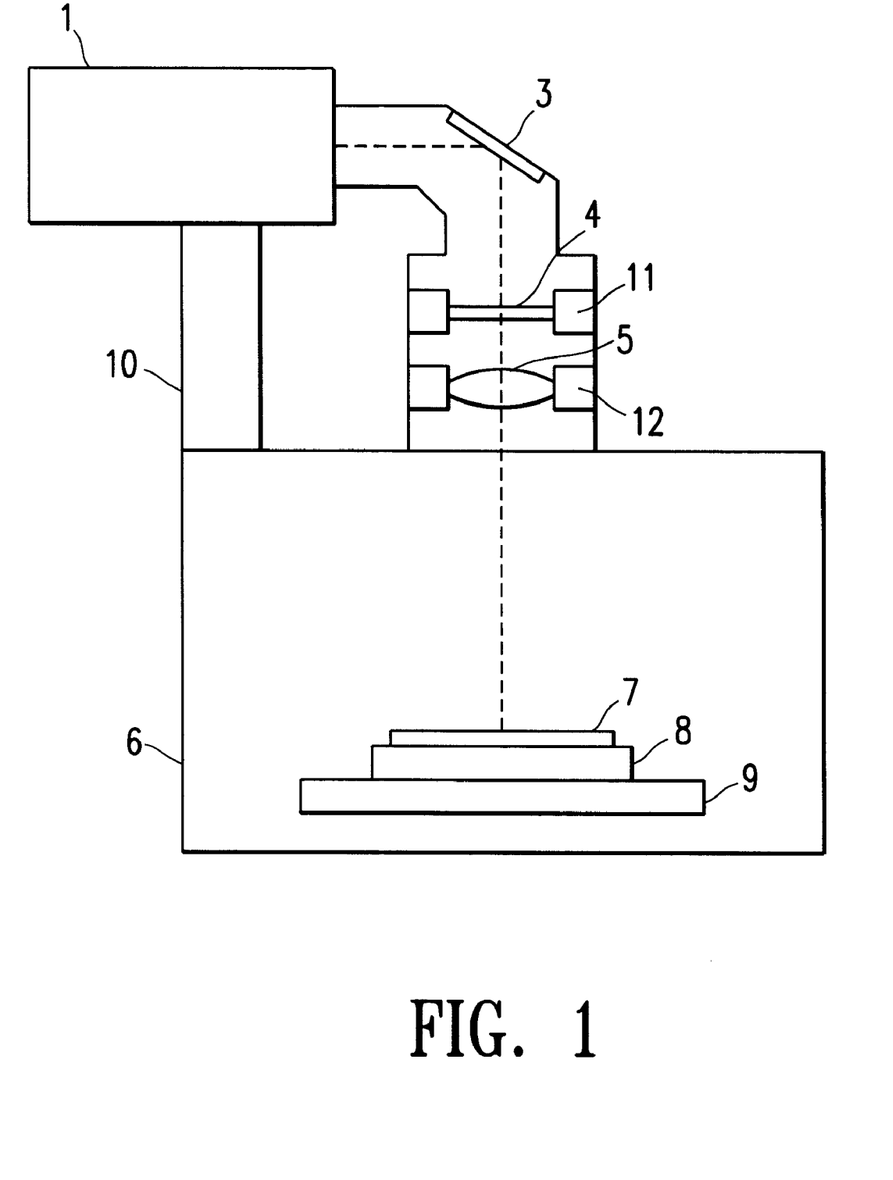
FIG. 1 is a diagram schematically illustrating a lithography apparatus used for a process for producing semiconductors.

As described above, the low thermal expansion ceramics of the present invention has a small coefficient of thermal expansion and a high Young's modulus, and can be effectively used as various parts in a process for producing semiconductors having high resolution circuits. Particularly, as parts in the exposure apparatus. FIG. 1 schematically illustrates a lithography apparatus used for a process for producing semiconductors.

Referring to FIG. 1, a beam such as i-ray, excimer laser or X-ray, emitted from a source of light 1 travels through a mirror 3 in a light guide passage 2, passes through an optical unit equipped with a reticle stage 4 on which the diagram of a circuit pattern is placed and an optical element such as a lens 5, and falls on a silicon wafer 7 placed in a main body 6 of the lithography apparatus. The wafer 7 is placed on the surface of an electrostatic chuck 8 which is placed on a stage 9.

In the lithography apparatus 6, the optical elements such as the source of light 1, reticle stage 4 and lens 5 are firmly supported by support members 10, 11 and 12 secured to the lithography apparatus 6. The stage 9 is moved at a high speed up to an exposure zone by drive systems such as an X stage and an XY stage, so that the silicon wafer 7 held on the electrostatic chuck 8 thereon is brought to a predetermined exposure zone.

The support members 10, 11 and 12 firmly supporting the above-mentioned optical elements, and the members such as electrostatic chuck 8 and stage 9 holding the silicon wafer 7, shall not vibrate even slightly during the exposure to light or shall not be thermally deformed by a change in the temperature. This is because, vibration or deformation due to heat deteriorates the precision of exposure, and makes it difficult to highly precisely form high resolution circuit patterns on the silicon wafer 7.

The ceramics of the present invention has a low coefficient of thermal expansion, is deformed little by a change in the temperature and has a very high Young's modulus. Therefore, the ceramics of the invention has a large resistance against vibration and is very useful as the above-mentioned members.

EXAMPLES

Experiment 1

A cordierite powder having an average particle diameter of 3 μm was blended with powders of $Y_2O_3$, $Yb_2O_3$, $Er_2O_3$ or $CeO_2$ having an average particle diameter of 1 μm at ratios shown in Tables 1 and 2, followed by mixing in a ball mill for 24 hours. The mixed powders were then molded in metal molds under a pressure of 1 ton/cm$^2$. The molded articles were introduced into a pot of silicon carbide, fired under the conditions shown in Tables 1 and 2, and were cooled down to 1000° C. at average cooling rates shown in Tables 1 and 2 to obtain various ceramics.

The thus obtained ceramics were polished and ground into a size of 3×4×15 mm, and their coefficients of thermal expansion were measured at 10 to 40° C. Relying upon the ultrasonic pulse method, furthermore, their Young's moduli were measured at room temperature. The results were as shown in Tables 1 and 2.

The ceramics were also measured for their relative densities according to the Archimedes' method. The results were as shown in Tables 1 and 2.

TABLE 1

| Sample No. | Composition (% by weight) Cordierite | Oxide of rare earth element | | Firing condition Temperature (° C.) | Cooling rate (° C./min) | Grain boundary crystal phase | Coefficient of thermal expansion $10^{-6}$ (/° C.) | Young's modulus (Gpa) | Relative density (%) |
|---|---|---|---|---|---|---|---|---|---|
| *1 | 95 | $Y_2O_3$ | 5 | 1350 | 5 | no crystal phase | 0.6 | 110 | 94 |
| 2 | 92 | $Y_2O_3$ | 8 | 1350 | 5 | $Y_2O_3 \cdot 2SiO_2$ | 0.2 | 130 | 95 |
| 3 | 90 | $Y_2O_3$ | 10 | 1300 | 5 | $Y_2O_3 \cdot 2SiO_2$ | 0.4 | 130 | 95 |
| 4 | 90 | $Y_2O_3$ | 10 | 1350 | 5 | $Y_2O_3 \cdot 2SiO_2$ | 0.3 | 130 | 96 |
| 5 | 90 | $Y_2O_3$ | 10 | 1400 | 5 | $Y_2O_3 \cdot 2SiO_2$ | 0.4 | 140 | 96 |
| 6 | 90 | $Y_2O_3$ | 10 | 1450 | 5 | $Y_2O_3 \cdot 2SiO_2$ | 0.3 | 140 | 97 |
| 7 | 90 | $Y_2O_3$ | 10 | 1500 | 5 | $Y_2O_3 \cdot 2SiO_2$ | 0.5 | 140 | 97 |
| *8 | 90 | $Y_2O_3$ | 10 | 1550 | 5 | melt, no crystal | — | — | — |
| 9 | 90 | $Y_2O_3$ | 10 | 1350 | 2 | $Y_2O_3 \cdot 2SiO_2$ | 0.3 | 140 | 95 |
| 10 | 90 | $Y_2O_3$ | 10 | 1350 | 7 | $Y_2O_3 \cdot 2SiO_2$ | 0.4 | 140 | 95 |
| 11 | 90 | $Y_2O_3$ | 10 | 1350 | 10 | $Y_2O_3 \cdot 2SiO_2$ | 0.5 | 130 | 96 |
| *12 | 90 | $Y_2O_3$ | 10 | 1350 | 15 | no crystal phase | 0.7 | 110 | 95 |
| *13 | 90 | $Y_2O_3$ | 10 | 1350 | 20 | no crystal phase | 0.7 | 100 | 95 |
| 14 | 82 | $Y_2O_3$ | 18 | 1350 | 5 | $Y_2O_3 \cdot 2SiO_2$ | 0.3 | 140 | 97 |
| 15 | 80 | $Y_2O_3$ | 20 | 1350 | 5 | $Y_2O_3 \cdot 2SiO_2$ | 0.4 | 150 | 97 |
| *16 | 75 | $Y_2O_3$ | 25 | 1350 | 5 | $Y_2O_3 \cdot 2SiO_2$ | 1.3 | 150 | 97 |

Samples marked with * lie outside the scope of the invention.

TABLE 2

| Sample No. | Composition (% by weight) Cordierite | Composition (% by weight) Oxide of rare earth element | | Firing condition Temperature (° C.) | Firing condition Cooling rate (° C./min) | Grain boundary crystal phase | Coefficient of thermal expansion $10^{-6}$ (/° C.) | Young's modulus (Gpa) | Relative density (%) |
|---|---|---|---|---|---|---|---|---|---|
| 17 | 90 | $Yb_2O_3$ | 10 | 1350 | 5 | $Yb_2O_3.2SiO_2$ | 0.2 | 130 | 95 |
| 18 | 82 | $Yb_2O_3$ | 18 | 1350 | 5 | $Yb_2O_3.2SiO_2$ | 0.4 | 140 | 97 |
| 19 | 90 | $Yb_2O_3$ | 10 | 1400 | 5 | $Yb_2O_3.2SiO_2$ | 0.3 | 140 | 96 |
| 20 | 90 | $Yb_2O_3$ | 10 | 1450 | 5 | $Yb_2O_3.2SiO_2$ | 0.3 | 140 | 97 |
| *21 | 90 | $Yb_2O_3$ | 10 | 1350 | 20 | no crystal phase | 0.7 | 120 | 95 |
| 22 | 91 | $Er_2O_3$ | 9 | 1350 | 5 | $Er_2O_3.2SiO_2$ | 0.2 | 130 | 95 |
| 23 | 90 | $Er_2O_3$ | 10 | 1350 | 5 | $Er_2O_3.2SiO_2$ | 0.2 | 130 | 95 |
| 24 | 90 | $Er_2O_3$ | 10 | 1400 | 5 | $Er_2O_3.2SiO_2$ | 0.2 | 130 | 95 |
| 25 | 90 | $Er_2O_3$ | 10 | 1450 | 5 | $Er_2O_3.2SiO_2$ | 0.3 | 130 | 96 |
| *26 | 90 | $Er_2O_3$ | 10 | 1350 | 15 | no crystal phase | 0.7 | 120 | 95 |
| 27 | 91 | $CeO_2$ | 9 | 1350 | 5 | $Ce_2O_3.2SiO_2$ | 0.2 | 130 | 95 |
| 28 | 90 | $CeO_2$ | 10 | 1350 | 5 | $Ce_2O_3.2SiO_2$ | 0.3 | 130 | 95 |
| 29 | 90 | $CeO_2$ | 10 | 1400 | 5 | $Ce_2O_3.2SiO_2$ | 0.4 | 130 | 96 |
| 30 | 90 | $CeO_2$ | 10 | 1450 | 5 | $Ce_2O_3.2SiO_2$ | 0.4 | 130 | 97 |
| *31 | 90 | $CeO_2$ | 10 | 1350 | 15 | no crystal phase | 0.7 | 120 | 95 |

Samples marked with * lie outside the scope of the invention.

As shown in Tables 1 and 2, the oxide of a rare earth element was added at a predetermined ratio to the cordierite, whereby a crystal phase of disilicate $RE_2O_3.2SiO_2$ ($RE_2Si_2O_7$, RE: rare earth element) was precipitated, the coefficient of thermal expansion was decreased to be not larger than $1 \times 10^{-6}$/° C. and the Young's modulus could be increased to be not smaller than 130 GPa. The Young's modulus increased with an increase in the amount of addition thereof.

However, the sample No. 1 having a relative density of not larger than 95% exhibited a Young's modulus that was smaller than 130 GPa. The sample No. 16 containing $Y_2O_3$ in an amount of larger than 20% by weight exhibited a high Young's modulus but exhibited a coefficient of thermal expansion that was larger than $1 \times 10^{-6}$/° C.

In the sample No. 8 fired at a temperature of higher than 1500° C., the molded article melts, thereby, ceramics could not be obtained.

In the samples Nos. 12, 13, 21, 26 and 31 that were cooled down to 1000° C. at cooling rates greater than 10° C./min., the crystal phase of disilicate $RE_2O_3.2SiO_2$ did not precipitate. As a result, Young's moduli were low and the coefficients of thermal expansion were great. It will thus be understood that precipitating the crystal phase of disilicate $RE_2O_3.2SiO_2$ on the grain boundaries is important for increasing the Young's modulus and for decreasing the thermal expansion.

Experiment 2

Powders of various additives were mixed into the cordierite powder (having an average particle diameter of 2 μm and a BET specific surface area of 2 m²/g) so as to obtain compositions shown in Tables 3 to 6. The mixed powders were molded in metal molds under a pressure of 1 ton/cm².

Among the powders of additives, the silicon nitride powder, silicon carbide powder and silicon oxinitride powder that were used possessed an average particle diameter of 0.6 μm, and the powders of other additives that were used possessed an average particle diameter of 1 μm.

The obtained molded articles were introduced into the pot of silicon carbide, and were fired and cooled under the conditions of Tables 3 to 6 to obtain sintered products. The samples were prepared from the sintered products in the same manner as in Experiment 1, and were measured for their coefficients of thermal expansion and Young's moduli, and were further identified for their crystal phases other than the cordierite. The results were as shown in Tables 3 to 6. Relative densities of the sintered products were also shown in Tables 3 to 6.

TABLE 3

| Sample No. | Composition (% by weight) Cordierite | Composition (% by weight) Powdery additive note 1) | | Firing temperature (° C.) | Cooling temperature (° C.) | Relative density (%) | Coefficient of thermal expansion $10^{-6}$ (/° C.) | Young's modulus (Gpa) | Other crystal phases |
|---|---|---|---|---|---|---|---|---|---|
| *1 | 100 | — | — | 1400 | 15 | 93 | 0.1 | 110 | none |
| *2 | 99.98 | $CaCO_3$ | 0.02 | 1400 | 15 | 94 | 0.2 | 115 | none |
| 3 | 99 | $CaCO_3$ | 1 | 1400 | 3 | 96 | 0.4 | 140 | $CaAl_2Si_2O_8$ |
| 4 | 97 | $CaCO_3$ | 3 | 1400 | 3 | 98 | 0.2 | 140 | $CaAl_2Si_2O_8$ |
| 5 | 95 | $CaCO_3$ | 5 | 1400 | 3 | 98 | 0.2 | 145 | $CaAl_2Si_2O_8$ |
| *6 | 95 | $CaCO_3$ | 5 | 1400 | 15 | 98 | 0.3 | 120 | none |
| 7 | 92 | $CaCO_3$ | 8 | 1400 | 3 | 99 | 0.3 | 160 | $CaAl_2Si_2O_8$ |
| 8 | 90 | $CaCO_3$ | 10 | 1400 | 3 | 99 | 0.4 | 160 | $CaAl_2Si_2O_8$ |

TABLE 3-continued

| Sample No. | Composition (% by weight) | | | | Firing temperature (° C.) | Cooling temperature (° C.) | Relative density (%) | Coefficient of thermal expansion $10^{-6}$ (/° C.) | Young's modulus (Gpa) | Other crystal phases |
|---|---|---|---|---|---|---|---|---|---|---|
| | Cordierite | Powdery additive note 1) | | | | | | | | |
| 9 | 88 | $CaCO_3$ | 12 | — | 1400 | 3 | 99 | 0.6 | 165 | $CaAl_2Si_2O_8$ |
| *10 | 90 | $CaCO_3$ | 5 | $Y_2O_3$ 5 | 1400 | 15 | 98 | 0.3 | 125 | none |
| 11 | 90 | $CaCO_3$ | 5 | $Y_2O_3$ 5 | 1400 | 3 | 99 | 0.3 | 155 | $CaAl_2Si_2O_8$, $Y_2Si_2O_7$ |
| 12 | 85 | $CaCO_3$ | 5 | $Y_2O_3$ 10 | 1400 | 3 | 99 | 0.2 | 160 | $CaAl_2Si_2O_8$, $Y_2Si_2O_7$ |
| 13 | 75 | $CaCO_3$ | 5 | $Y_2O_3$ 20 | 1400 | 3 | 99 | 0.4 | 165 | $CaAl_2Si_2O_8$, $Y_2Si_2O_7$ |
| *14 | 75 | $CaCO_3$ | 5 | $Y_2O_3$ 25 | 1400 | 3 | 99 | 1.2 | 160 | $CaAl_2Si_2O_8$, $Y_2Si_2O_7$ |
| 15 | 93 | $CaCO_3$ | 5 | $Yb_2O_3$ 2 | 1400 | 3 | 98 | 0.3 | 160 | $CaAl_2Si_2O_8$, $Yb_2Si_2O_7$ |
| 16 | 90 | $CaCO_3$ | 5 | $Er_2O_3$ 5 | 1400 | 3 | 99 | 0.3 | 165 | $CaAl_2Si_2O_8$, $Er_2Si_2O_7$ |

Samples marked with * lie outside the scope of the invention.
Note 1) Numerals represent amounts in terms of oxides.

TABLE 4

| Sample No. | Composition (% by weight) | | | | | | Firing temperature (° C.) | Relative density (%) | Coefficient of thermal expansion $10^{-6}$ (/° C.) | Young's modulus (Gpa) | Other crystal phases |
|---|---|---|---|---|---|---|---|---|---|---|---|
| | Cordierite | Powdery additive | | | | | | | | | |
| *17 | 95 | $SrCO_3$ | 5 | — | | — | 1100 | 88 | 0.3 | 110 | $SrAl_2Si_2O_8$ |
| 18 | 95 | $SrCO_3$ | 5 | — | | — | 1250 | 95 | 0.2 | 140 | $SrAl_2Si_2O_8$ |
| 19 | 95 | $SrCO_3$ | 5 | — | | — | 1400 | 96 | 0.2 | 150 | $SrAl_2Si_2O_8$ |
| 20 | 95 | $SrCO_3$ | 5 | — | | — | 1450 | 99 | 0.4 | 140 | $SrAl_2Si_2O_8$ |
| *21 | 95 | $SrCO_3$ | 5 | — | | — | 1550 | | | melt | |
| 22 | 93 | $SrCO_3$ | 5 | $Y_2O_3$ 2 | | — | 1400 | 99 | 0.3 | 130 | $SrAl_2Si_2O_8$, $Y_2Si_2O_7$ |
| 23 | 90 | $SrCO_3$ | 5 | $Y_2O_3$ 5 | | — | 1400 | 100 | 0.3 | 160 | $SrAl_2Si_2O_8$, $Y_2Si_2O_7$ |
| 24 | 90 | $SrCO_3$ | 5 | — | $Si_3N_4$ | 5 | 1400 | 97 | 0.3 | 170 | $SrAl_2Si_2O_8$, $Si_3N_4$ |
| 25 | 85 | $SrCO_3$ | 5 | — | $Si_3N_4$ | 10 | 1400 | 97 | 0.3 | 170 | $SrAl_2Si_2O_8$, $Si_3N_4$ |
| 26 | 65 | $SrCO_3$ | 5 | — | $Si_3N_4$ | 30 | 1400 | 95 | 0.4 | 180 | $SrAl_2Si_2O_8$, $Si_3N_4$ |
| *27 | 55 | $SrCO_3$ | 5 | — | $Si_3N_4$ | 40 | 1400 | 92 | 1.1 | 160 | $SrAl_2Si_2O_8$, $Si_3N_4$ |
| 28 | 80 | $SrCO_3$ | 5 | $Y_2O_3$ 5 | $Si_3N_4$ | 10 | 1400 | 99 | 0.4 | 170 | $SrAl_2Si_2O_8$, $Si_3N_4$, $Y_2Si_2O_7$ |
| 29 | 75 | $SrCO_3$ | 5 | $Yb_2O_3$ 5 | $Si_3N_4$ | 15 | 1400 | 99 | 0.4 | 170 | $SrAl_2Si_2O_8$, $Si_3N_4$, $Y_2Si_2O_7$ |
| 30 | 85 | $SrCO_3$ | 5 | — | SiC | 10 | 1400 | 97 | 0.4 | 175 | $SrAl_2Si_2O_8$, SiC |
| 31 | 85 | $SrCO_3$ | 5 | — | $Si_3N_4O$ | 10 | 1400 | 98 | 0.2 | 165 | $SrAl_2Si_2O_8$, $Si_2N_2O$ |
| 32 | 95 | $BaCO_3$ | 5 | — | | — | 1400 | 96 | 0.1 | 145 | $BaAl_2Si_2O_8$, $Y_2Si_2O_7$ |
| 33 | 94 | $BaCO_3$ | 5 | $Y_2O_3$ 1 | | — | 1400 | 96 | 0.4 | 140 | $BaAl_2Si_2O_8$, $Y_2Si_2O_7$ |
| 34 | 87 | $BaCO_3$ | 5 | $Y_2O_3$ 8 | | — | 1400 | 99 | 0.5 | 145 | $BaAl_2Si_2O_8$, $Y_2Si_2O_7$ |
| 35 | 90 | $BaCO_3$ | 5 | — | $Si_3N_4$ | 5 | 1400 | 97 | 0.4 | 170 | $BaAl_2Si_2O_8$, $Si_3N_4$ |
| 36 | 85 | $BaCO_3$ | 5 | — | $Si_3N_4$ | 10 | 1400 | 98 | 0.4 | 170 | $BaAl_2Si_2O_8$, $Si_3N_4$ |

Samples marked with * lie outside the scope of the invention.
The samples were cooled down to 1000° C. all at a cooling rate of 3° C./min.

TABLE 5

| Sample No. | Composition (% by weight) | | | | | | Firing temperature (° C.) | Relative density (%) | Coefficient of thermal expansion × $10^{-6}$ (/° C.) | Young's modulus (Gpa) | Other crystal phases |
|---|---|---|---|---|---|---|---|---|---|---|---|
| | Cordierite | Powdery additive | | | | | | | | | |
| 37 | 95 | $Ga_2O_3$ | 5 | — | | — | | 1400 | 99 | 0.2 | 155 | $Ga_2Si_2O_7$ |
| 38 | 95 | $In_2O_3$ | 5 | — | | — | | 1400 | 97 | 0.2 | 160 | $In_2Si_2O_7$ |
| 39 | 90 | $Ga_2O_3$ | 5 | $Yb_2O_3$ | 5 | — | | 1400 | 98 | 0.4 | 160 | $(Ga,Yb)_2Si_2O_7$ |
| 40 | 90 | $Ga_2O_3$ | 5 | — | | $Si_3N_4$ | 5 | 1400 | 98 | 0.4 | 170 | $Ga_2Si_2O_7, Si_3N_4$ |

Samples marked with * lie outside the scope of the invention.
The samples were cooled down to 1000° C. all at a cooling rate of 5° C./min.

TABLE 6

| Sample No. | Composition (% by weight) | | | | | | | | Firing temperature (° C.) | Relative density (%) | Coefficient of thermal expansion $10^{-6}$ (/° C.) | Young's modulus (Gpa) | Other crystal phases |
|---|---|---|---|---|---|---|---|---|---|---|---|---|---|
| | Cordierite | Powdery additive | | | | | | | | | | | |
| 41 | 92 | $SnO_2$ | 5 | $Y_2O_3$ | 3 | — | | | 1400 | 98 | 0.2 | 150 | $Y_2Si_2O_7$ |
| 42 | 96 | $GeO_2$ | 1 | $Y_2O_3$ | 3 | — | | | 1400 | 95 | 0.3 | 130 | $Y_2Si_2O_7$ |
| 43 | 92 | $GeO_2$ | 5 | $Y_2O_3$ | 3 | — | | | 1400 | 98 | 0.2 | 155 | $Y_2Si_2O_7$ |
| 44 | 89 | $GeO_2$ | 8 | $Y_2O_3$ | 3 | — | | | 1400 | 99 | 0.4 | 140 | $Y_2Si_2O_7$ |
| 45 | 90 | $GeO_2$ | 5 | $Yb_2O_3$ | 5 | — | | | 1400 | 99 | 0.3 | 140 | $Yb_2Si_2O_7$ |
| 46 | 85 | $GeO_2$ | 5 | $Yb_2O_3$ | 5 | $Si_3N_4$ | 5 | | 1400 | 99 | 0.4 | 170 | $Yb_2Si_2O_7, Si_3N_4$ |

The samples were cooled down to 1000° C. all at a cooling rate of 5° C./min.

As will be obvious from Tables 3 to 6, small Young's moduli were exhibited by the samples Nos. 1, 2 and 41 containing no compound or small amounts of compound of an element for forming the disilicate or the aluminosilicate. The sample No. 9 containing larger than 10% by weight of a compound of an alkaline earth element other than Mg, exhibited a coefficient of thermal expansion of higher than $0.5\times10^{-6}/°$ C. The sample No. 14 containing larger than 20% by weight of an oxide of a rare earth element and the sample No. 27 containing larger than 30% by weight of the silicon nitride, exhibited coefficients of thermal expansion that were not smaller than $1.0\times10^{-6}/°$ C. the sample No. 21 fired at a temperature of higher than 1500° C. dissolved, and the sample No. 17 fired at a temperature of lower than 1200° C. exhibited a relative density of lower than 95% and a low Young's modulus.

In contrast with these Comparative Experiments, the samples of the present invention all exhibited coefficients of thermal expansion of not higher than $1\times10^{-6}/°$ C. and Young's moduli that were not smaller than 130 GPa. Among them, the samples to which silicon nitride, silicon carbide and silicon oxinitride were added, exhibited Young's moduli that were not lower than 160 GPa.

The samples Nos. 1, 2 and 6 in which the disilicate crystal phase or the aluminum silicate crystal phase was not precipitated, all exhibited Young's moduli that were smaller than 130 GPa.

Experiment 3

A cordierite powder having a purity of not lower than 99% and an average particle diameter of 3 μm was blended with powders of oxides of rare earth elements $Y_2O_3$, $Yb_2O_3$, $Er_2O_3$ or $CeO_2$ having an average particle diameter of 1 μm at ratios shown in Tables 7 and 8, followed by mixing in a ball mill for 24 hours. The mixed powders were then molded in metal molds under a pressure of 1 ton/cm² to obtain molded articles having a relative density of 58%.

The molded articles were introduced into the pot of silicon carbide or alumina, and fired in an open air at temperatures shown in Tables 7 and 8 for 5 hours. The obtained sintered products were measured for their relative densities relying on the Archimedes' method. The results were as shown in Tables 7 and 8.

After the firing, the heat treatment was further conducted in a high-pressure atmosphere under the conditions shown in Tables 7 and 8 for one hour. The pressurized processing conditions were changed as shown in Tables 7 to 8 to obtain various ceramics.

Samples were prepared from the ceramics in the same manner as in Experiment 1, and were measured for their coefficients of thermal expansion and Young's moduli, and were further identified for their crystal phases other than the cordierite. Moreover, porosity and maximum void diameters were measured at room temperature. The results were as shown in Tables 9 and 10.

The maximum void diameter was measured by observing the texture at given ten points by using an electron microphotograph (magnification of 200 times).

TABLE 7

| Sample No. | Composition (% by weight) Cordierite | Composition (% by weight) Oxide of rare earth element | | Firing temperature (° C.) | Relative density after firing (%) | Heat-treating condition Atmosphere | Heat-treating condition Temperature (° C.) | Heat-treating condition Pressure (atm) | Cooling rate (° C./min) |
|---|---|---|---|---|---|---|---|---|---|
| *1 | 90 | Y₂O₃ | 10 | 1375 | 97.5 | Ar | 500 | 2000 | 15 |
| 2 | 90 | Y₂O₃ | 10 | 1375 | 97.5 | Ar | 900 | 2000 | 5 |
| 3 | 90 | Yb₂O₃ | 10 | 1375 | 98.1 | Ar | 900 | 2000 | 5 |
| 4 | 90 | Er₂O₃ | 10 | 1375 | 97.8 | Ar | 900 | 2000 | 5 |
| 5 | 90 | CeO₂ | 10 | 1350 | 95.5 | Ar | 900 | 2000 | 5 |
| 6 | 90 | Y₂O₃ | 10 | 1375 | 97.5 | Ar | 1150 | 2000 | 5 |
| 7 | 90 | Yb₂O₃ | 10 | 1375 | 98.1 | Ar | 1150 | 2000 | 5 |
| 8 | 90 | Er₂O₃ | 10 | 1375 | 97.8 | Ar | 1150 | 2000 | 5 |
| 9 | 90 | CeO₂ | 10 | 1350 | 95.5 | Ar | 1150 | 2000 | 5 |
| 10 | 90 | Y₂O₃ | 10 | 1375 | 97.5 | Ar | 1250 | 2000 | 5 |
| 11 | 90 | Yb₂O₃ | 10 | 1375 | 98.1 | Ar | 1250 | 2000 | 5 |
| 12 | 90 | Er₂O₃ | 10 | 1375 | 97.8 | Ar | 1250 | 2000 | 5 |
| 13 | 90 | CeO₂ | 10 | 1350 | 95.5 | Ar | 1250 | 2000 | 5 |
| 14 | 90 | Y₂O₃ | 10 | 1375 | 97.5 | Ar | 1350 | 2000 | 5 |
| 15 | 90 | Yb₂O₃ | 10 | 1375 | 98.1 | Ar | 1350 | 2000 | 5 |
| 16 | 90 | Er₂O₃ | 10 | 1375 | 97.8 | Ar | 1350 | 2000 | 5 |
| 17 | 90 | CeO₂ | 10 | 1350 | 95.5 | Ar | 1350 | 2000 | 5 |
| 18 | 90 | Y₂O₃ | 10 | 1400 | 98.5 | Ar | 1400 | 2000 | 5 |
| 19 | 90 | Yb₂O₃ | 10 | 1400 | 99.1 | Ar | 1400 | 2000 | 5 |
| 20 | 90 | Er₂O₃ | 10 | 1400 | 98.8 | Ar | 1400 | 2000 | 5 |
| 21 | 90 | CeO₂ | 10 | 1400 | 97.5 | Ar | 1400 | 2000 | 5 |
| *22 | 90 | Y₂O₃ | 10 | 1375 | 97.5 | Ar | 1450 | 2000 | 5 |

Samples marked with * lie outside the scope of the invention.

TABLE 8

| Sample No. | Composition (% by weight) Cordierite | Composition (% by weight) Oxide of rare earth element | | Firing temperature (° C.) | Relative density after firing (%) | Heat-treating condition Atmosphere | Heat-treating condition Temperature (° C.) | Heat-treating condition Pressure (atm) |
|---|---|---|---|---|---|---|---|---|
| *23 | 90 | Y₂O₃ | 10 | 1375 | 97.5 | Ar | 1150 | 50 |
| 24 | 90 | Y₂O₃ | 10 | 1375 | 97.5 | Ar | 1150 | 100 |
| 25 | 90 | Y₂O₃ | 10 | 1375 | 98.1 | Ar | 1150 | 500 |
| 26 | 90 | Y₂O₃ | 10 | 1375 | 97.8 | Ar | 1150 | 1000 |
| 27 | 90 | Y₂O₃ | 10 | 1350 | 95.5 | Ar | 1150 | 1500 |
| 28 | 90 | Y₂O₃ | 10 | 1375 | 97.5 | Air | 1150 | 2000 |
| 29 | 90 | Y₂O₃ | 10 | 1375 | 97.5 | N₂ | 1150 | 2000 |
| *30 | 100 | — | 0 | 1400 | 97.2 | Ar | 1150 | 2000 |
| 31 | 99 | Y₂O₃ | 1 | 1400 | 97.4 | Ar | 1150 | 2000 |
| 32 | 95 | Y₂O₃ | 5 | 1375 | 97.8 | Ar | 1150 | 2000 |
| 33 | 86 | Y₂O₃ | 14 | 1375 | 97.7 | Ar | 1150 | 2000 |
| 34 | 82 | Y₂O₃ | 18 | 1375 | 97.5 | Ar | 1150 | 2000 |
| 35 | 80 | Y₂O₃ | 20 | 1375 | 97.6 | Ar | 1150 | 2000 |
| *36 | 75 | Y₂O₃ | 25 | 1375 | 97.5 | Ar | 1150 | 2000 |
| *37 | 90 | Y₂O₃ | 10 | 1250 | 80.2 | Ar | 1150 | 2000 |
| *38 | 90 | Y₂O₃ | 10 | 1300 | 86.5 | N₂ | 1150 | 2000 |

Samples marked with * lie outside the scope of the invention.
The samples were cooled down to 1000° C. all at a cooling rate of 5° C./min.

TABLE 9 / TABLE 9-continued

| Sample No. | Porosity (%) | Max. Void diameter (μm) | Coefficient of thermal expansion × 10⁻⁶/° C. | Grain boundary crystal phase | Young's modulus (Gpa) |
|---|---|---|---|---|---|
| *1 | 2.0 | 10.0 | 0.3 | none | 110 |
| 2 | 0.09 | 4.3 | 0.3 | DS | 130 |
| 3 | 0.03 | 4.1 | 0.5 | DS | 133 |
| 4 | 0.06 | 4.4 | 0.2 | DS | 130 |
| 5 | 0.1 | 3.9 | 0.5 | DS | 130 |
| 6 | 0.08 | 4.2 | 0.3 | DS | 140 |
| 7 | 0.01 | 4.0 | 0.3 | DS | 140 |
| 8 | 0.05 | 4.3 | 0.2 | DS | 140 |

TABLE 9-continued

| Sample No. | Porosity (%) | Max. Void diameter (μm) | Coefficient of thermal expansion × 10 − 6/° C. | Grain boundary crystal phase | Young's modulus (Gpa) |
|---|---|---|---|---|---|
| 9 | 0.09 | 4.4 | 0.4 | DS | 135 |
| 10 | 0.08 | 2.0 | 0.3 | DS | 140 |
| 11 | 0.01 | 1.8 | 0.3 | DS | 145 |
| 12 | 0.05 | 1.6 | 0.2 | DS | 145 |
| 13 | 0.09 | 1.5 | 0.4 | DS | 135 |
| 14 | 0.08 | 0.8 | 0.3 | DS | 145 |
| 15 | 0.01 | 1.2 | 0.3 | DS | 145 |
| 16 | 0.05 | 0.9 | 0.2 | DS | 145 |
| 17 | 0.09 | 1.1 | 0.4 | DS | 140 |
| 18 | 0.07 | 0.7 | 0.4 | DS | 145 |
| 19 | 0.01 | 0.8 | 0.3 | DS | 150 |
| 20 | 0.05 | 1.1 | 0.4 | DS | 145 |
| 21 | 0.08 | 1.1 | 0.5 | DS | 140 |
| *22 | | | melted | | |

DS = $RE_2O_3 \cdot 2SiO_2$ (RE: rare earth element)

TABLE 10

| Sample No. | Porosity (%) | Max. Void diameter (μm) | Coefficient of thermal expansion × 10−6/° C. | Grain boundary crystal phase | Young's modulus (Gpa) |
|---|---|---|---|---|---|
| 23 | 1.2 | 18 | 0.3 | DS | 130 |
| 24 | 0.1 | 4.9 | 0.3 | DS | 140 |
| 25 | 0.09 | 4.8 | 0.3 | DS | 140 |
| 26 | 0.08 | 4.6 | 0.2 | DS | 140 |
| 27 | 0.08 | 4.4 | 0.2 | DS | 140 |
| 28 | 0.07 | 4.3 | 0.3 | DS | 140 |
| 29 | 0.07 | 4.3 | 0.4 | DS | 140 |
| *30 | 0.08 | 3.8 | 0.2 | DS | 125 |
| 31 | 0.07 | 3.7 | 0.2 | DS | 130 |
| 32 | 0.07 | 4.2 | 0.3 | DS | 135 |
| 33 | 0.07 | 4.1 | 0.5 | DS | 145 |
| 34 | 0.07 | 4.0 | 0.8 | DS | 145 |
| 35 | 0.07 | 3.9 | 0.9 | DS | 150 |
| *36 | 0.06 | 3.8 | 1.3 | DS | 155 |
| 37 | 4.5 | 30 | 0.4 | DS | 130 |
| 38 | 3.2 | 20 | 0.4 | DS | 130 |

DS = $RE_2O_3 \cdot 2SiO_2$ (RE: rare earth element)

From Tables 7 to 10, it will be understood that upon treating the sintered product containing not less than 80% by weight of cordierite and having a relative density of not lower than 90% under the conditions of a pressure of not lower than 100 atms, and a temperature of 900 to 1400° C., it is made possible to obtain ceramics having a further increased relative density and a decreased porosity of not larger than 0.1%.

However, the sample No. 22 that was treated at a temperature in excess of 1400° C. under an elevated pressure, was partly melted. The sample No. 1 that was treated at a temperature lower than 900° C. under an elevated pressure possessed a porosity of larger than 0.1%. The sample No. 36 containing larger than 20% by weight of an oxide of a rare earth element exhibited a coefficient of thermal expansion in excess of $1.0 \times 10^{-6}$/° C. The sample No. 30 containing less than 1% by weight of the oxide of a rare earth element could be fired at a temperature range of as very narrow as ±5° C.

The sample No. 23 heat-treated under a pressure of lower than 100 atms. possessed a porosity that was larger than 0.1%. When the samples Nos. 37 and 38 having relative densities of smaller than 90% of before being treated under elevated pressure conditions were used, the porosity could not be decreased to be smaller than 0.1% and the maximum void diameter could not be decreased down to be smaller than 5 μm even after the heat treatment under the elevated pressure conditions.

Experiment 4

The cordierite powder having an average particle diameter of 3 μm was blended with oxides of various rare earth elements having an average particle diameter of 1 μm, followed by mixing in a ball mill for 24 hours (blended compositions are shown in Tables 11 and 12) in the same manner as in Experiment 3. The mixed powders were press-molded, the obtained molded articles were buried in a carbon powder, subjected to the hot-press firing in an argon stream having a predetermined oxygen partial pressure, and were cooled down to 1000° C. at a cooling rate of 5° C./min. to thereby obtain various sintered products. Tables 11 and 12 show oxygen partial pressures, firing pressures and temperatures in the firing atmosphere.

The obtained sintered products were measured for their relative densities, coefficients of thermal expansion, Young's moduli, porosities and maximum void diameters in the same manner as in Experiment 3. The results were as shown in Tables 13 and 14. Moreover, the carbon contents in the sintered products were measured and the results were as shown in Tables 13 and 14.

TABLE 11

| Sample No. | Composition (% by weight) Cordierite | $RE_2O_3$ | | Firing temperature (° C.) | $O_2$ partial pressure (atm) | Pressure (kg/cm²) |
|---|---|---|---|---|---|---|
| 1 | 90 | $Y_2O_3$ | 10 | 1350 | 0.01 | 300 |
| 2 | 90 | $Yb_2O_3$ | 10 | 1350 | 0.01 | 300 |
| 3 | 90 | $Er_2O_3$ | 10 | 1350 | 0.01 | 300 |
| 4 | 90 | $CeO_2$ | 10 | 1350 | 0.01 | 300 |
| 5 | 90 | $Y_2O_3$ | 10 | 1350 | 0.02 | 300 |
| 6 | 90 | $Y_2O_3$ | 10 | 1350 | 0.03 | 300 |
| 7 | 90 | $Y_2O_3$ | 10 | 1350 | 0.04 | 300 |
| 8 | 90 | $Y_2O_3$ | 10 | 1350 | 0.05 | 300 |
| 9 | 90 | $Yb_2O_3$ | 10 | 1350 | 0.05 | 300 |
| 10 | 90 | $Er_2O_3$ | 10 | 1350 | 0.05 | 300 |
| 11 | 90 | $CeO_2$ | 10 | 1350 | 0.05 | 300 |
| 12 | 90 | $Y_2O_3$ | 10 | 1350 | 0.10 | 300 |
| 13 | 90 | $Yb_2O_3$ | 10 | 1350 | 0.10 | 300 |
| 14 | 90 | $Er_2O_3$ | 10 | 1350 | 0.10 | 300 |
| 15 | 90 | $CeO_2$ | 10 | 1350 | 0.10 | 300 |
| 16 | 90 | $Y_2O_3$ | 10 | 1350 | 0.20 | 300 |
| 17 | 90 | $Y_2O_3$ | 10 | 1350 | 0.30 | 300 |
| 18 | 90 | $Y_2O_3$ | 10 | 1400 | 0.05 | 300 |

Samples marked with * lie outside the scope of the invention.

TABLE 12

| Sample No. | Composition (% by weight) Cordierite | $RE_2O_3$ | | Firing temperature (° C.) | $O_2$ partial pressure (atm) | Pressure (kg/cm²) |
|---|---|---|---|---|---|---|
| *19 | 90 | $Y_2O_3$ | 10 | 1350 | 0.05 | 50 |
| 20 | 90 | $Y_2O_3$ | 10 | 1350 | 0.05 | 100 |
| 21 | 90 | $Y_2O_3$ | 10 | 1350 | 0.05 | 300 |
| 22 | 90 | $Y_2O_3$ | 10 | 1350 | 0.05 | 500 |
| *23 | 100 | — | | 1350 | 0.05 | 300 |
| 24 | 99 | $Y_2O_3$ | 1 | 1350 | 0.05 | 300 |
| 25 | 95 | $Y_2O_3$ | 5 | 1350 | 0.05 | 300 |
| 26 | 86 | $Y_2O_3$ | 14 | 1350 | 0.05 | 300 |
| 27 | 80 | $Y_2O_3$ | 20 | 1350 | 0.05 | 300 |
| *28 | 75 | $Y_2O_3$ | 25 | 1350 | 0.05 | 300 |

Samples marked with * lie outside the scope of the invention.

TABLE 13

| Sample No. | Porosity (%) | Max. Void diameter (μm) | Coefficient thermal expansion × $10^{-6}$ (/° C.) | Color exhibited | Carbon content (wt %) | Relative density (%) | Young's modulus (Gpa) |
|---|---|---|---|---|---|---|---|
| 1 | 0.09 | 4.0 | 0.3 | black | 1.1 | >99.9 | 140 |
| 2 | 0.01 | 2.0 | 0.2 | black | 1.9 | >99.9 | 145 |
| 3 | 0.02 | 2.7 | 0.3 | black | 2.0 | >99.9 | 140 |
| 4 | 0.03 | 2.9 | 0.4 | black | 1.9 | >99.9 | 135 |
| 5 | 0.05 | 3.7 | 0.3 | black | 1.8 | >99.9 | 140 |
| 6 | 0.04 | 3.5 | 0.3 | black | 1.7 | >99.9 | 140 |
| 7 | 0.02 | 2.5 | 0.3 | black | 1.5 | >99.9 | 140 |
| 8 | 0.05 | 4.0 | 0.3 | black | 1.0 | >99.9 | 140 |
| 9 | 0.05 | 3.8 | 0.2 | black | 1.0 | >99.9 | 145 |
| 10 | 0.05 | 4.1 | 0.3 | black | 1.0 | >99.9 | 140 |
| 11 | 0.05 | 4.2 | 0.4 | black | 1.1 | >99.9 | 135 |
| 12 | 0.08 | 4.0 | 0.3 | black | 1.0 | >99.9 | 140 |
| 13 | 0.07 | 3.8 | 0.2 | black | 1.2 | >99.9 | 145 |
| 14 | 0.08 | 4.1 | 0.3 | black | 1.1 | >99.9 | 140 |
| 15 | 0.09 | 4.2 | 0.4 | black | 1.0 | >99.9 | 135 |
| 16 | 0.09 | 4.0 | 0.3 | black | 0.2 | >99.9 | 140 |
| 17 | 0.08 | 4.1 | 0.4 | white | 0.05 | >99.9 | 140 |
| 18 | 0.04 | 3.5 | 0.3 | black | 0.8 | >99 | 140 |

TABLE 13

| Sample No. | Porosity (%) | Max. Void diameter (μm) | Coefficient thermal expansion × $10^{-6}$ (/° C.) | Color exhibited | Carbon content (wt %) | Relative density (%) | Young's modulus (Gpa) |
|---|---|---|---|---|---|---|---|
| *19 | 15.0 | 12.0 | 0.3 | black | 0.8 | 85 | 90 |
| 20 | 0.06 | 5.0 | 0.3 | black | 1.0 | >99.9 | 135 |
| 21 | 0.02 | 3.0 | 0.3 | black | 1.2 | >99.9 | 140 |
| 22 | 0.01 | 2.0 | 0.3 | black | 1.4 | >99.9 | 140 |
| *23 | 0.11 | 3.8 | 0.2 | black | 0.9 | >99.0 | 100 |
| 24 | 0.07 | 3.7 | 0.2 | black | 1.1 | >99.9 | 130 |
| 25 | 0.07 | 3.7 | 0.3 | black | 1.2 | >99.9 | 135 |
| 26 | 0.07 | 3.6 | 0.5 | black | 1.1 | >99.9 | 145 |
| 27 | 0.05 | 3.5 | 0.9 | black | 1.0 | >99.9 | 150 |
| *28 | 0.02 | 2.8 | 1.3 | black | 2.0 | >99.9 | 155 |

It will be understood from the results of Tables 11 to 14 that upon effecting the firing under an elevated pressure condition in a carbon atmosphere having an oxygen partial pressure of not larger than 0.2 atms., there are obtained very dense black ceramics having small porosities.

However, the sample No. 17 that was fired under a high oxygen partial pressure contained carbon in an amount of smaller than 0.1% by weight, and was not blackened. The sample No. 19 that was sintered under a pressure of lower than 100 kg/cm² possessed a porosity higher than 0.5% and was not so dense. The sample No. 28 containing larger than 20% by weight of an oxide of a rare earth element exhibited a coefficient of thermal expansion of larger than $1.0 \times 10^{-6}/°$ C. and the sample No. 23 containing less than 1% by weight of the oxide of a rare earth element exhibited a low Young's modulus and could be fired at a temperature region that was as very narrow as ±5° C.

It was confirmed that the crystal phase of disilicate represented by $RE_2O_3 \cdot 2SiO_2$ (RE: rare earth element) had precipitated in the samples containing not less than 1% by weight of the oxide of the rare earth element as measured by the X-ray diffraction.

Experiment 5

A square ceramic board having a side of 100 mm was prepared by using many ceramics obtained in Experiments 1 to 4, and was used as an XY-stage of a lithography apparatus, in order to examine the precision of a marking position by exposure to X-rays. In this case, the temperature of the atmosphere was set to be 25° C.±2° C.

When the ceramics having a coefficient of thermal expansion at 10 to 40° C. of not larger than $1 \times 10^{-6}/°$ C. and a Young' modulus of not smaller than 130 GPa was used, the precision of exposure was very high, i.e., 100 nm or smaller. When the ceramics having a coefficient of thermal expansion of larger than $1 \times 10^{-6}/°$ C. was used, on the other hand, the precision of exposure was larger than 100 nm.

Furthermore, the ceramic board was vertically erected with its one end being secured. A pendulum having a weight of 100 grams was hung from a portion just over the other end (upper end) of the ceramic board, and was naturally fallen down from an upper tilted direction to impart a shock to the upper end of the ceramic board from the transverse direction. Attenuation of vibration of the ceramic board at this moment was measured by using a distorting gauge in order to measure the time until the vibration has extinguished.

When the ceramic board having a Young's modulus of smaller than 130 GPa was used, a time of longer than 20 seconds was required until the vibration has extinguished. When the ceramic board having a Young's modulus of not smaller than 130 GPa was used, this time was not longer than 20 seconds. The time was shortened with an increase in the Young's modulus. The time was not longer than 18 seconds when the Young's modulus was not smaller than 150 GPa.

What is claimed is:

1. Low thermal expansion ceramics comprising:

a cordierite crystal phase; and a crystalline compound phase precipitated in grain boundaries of the cordierite phase comprising $(M^1)_2Si_2O_7$ or $(M^2)Si2Al_2O_3$, wherein M1 is an element selected from the group consisting of rare earth elements, Ga and In, wherein M2 is an alkaline earth element other than Mg, wherein when the element is a rare earth element, the element is contained in an amount of 1–20% by weight in terms of an oxide thereof, and when the element is Ga, In or an alkaline earth element other than Mg, the element is contained in an amount of 0.5%–10% by weight in terms of an oxide thereof, and wherein the ceramics have a relative density of not less than 95%, a coefficient of thermal expansion of not larger than $1\times10^{-6}/°$ C. at 10 to 40° C., and a Young's modulus of not less than 130 Gpa.

2. Low thermal expansion ceramics according to claim 1, further comprising not more than 30% by weight of at least one silicon compound selected from the group consisting of silicon nitride, silicon carbide, and silicon oxinitride.

3. Low thermal expansion ceramics according to claim 1, wherein said ceramics has a porosity of not larger than 0.1% and a maximum void diameter of not larger than 5 μm.

4. Low thermal expansion ceramics according to claim 1, wherein said ceramics contains carbon in an amount of from 0.1 to 2.0% by weight and exhibits black color.

5. A member made of the low thermal expansion ceramics of claim 1 used for semiconductor process equipment.

6. A member according to claim 5 used for supporting a semiconductor wafer in a lithography apparatus for forming high resolution circuit patterns on the semiconductor wafer.

7. A member according to claim 5 used for supporting an optical element in a lithography apparatus for forming high resolution circuit patterns on the semiconductor wafer.

* * * * *